(12) United States Patent
Didcock et al.

(10) Patent No.: US 6,741,134 B2
(45) Date of Patent: May 25, 2004

(54) DC FEEDBACK CONTROL CIRCUIT

(75) Inventors: Clifford Neil Didcock, Wantage (GB);
Charles Ronald Cook, Wakefield (GB);
Michael Geoffrey Andrew Wilson, London (GB); Charles Graeme Ritchie, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/151,433

(22) Filed: May 21, 2002

(65) Prior Publication Data
US 2002/0196082 A1 Dec. 26, 2002

(30) Foreign Application Priority Data

May 21, 2001 (EP) .............................. 01304467

(51) Int. Cl.$^7$ ................................ H03F 1/30
(52) U.S. Cl. ...................... 330/290; 330/257
(58) Field of Search ................. 330/252, 257, 330/259, 260, 261, 290, 29

(56) References Cited

U.S. PATENT DOCUMENTS

| | | | | |
|---|---|---|---|---|
| 4,420,724 A | * | 12/1983 | Owen | 330/277 |
| 4,451,799 A | | 5/1984 | Fujita | |
| 5,216,386 A | * | 6/1993 | Wyatt | 330/308 |
| 5,635,874 A | * | 6/1997 | Perrot | 330/259 |
| 5,714,909 A | | 2/1998 | Jackson | |

FOREIGN PATENT DOCUMENTS

| | | |
|---|---|---|
| JP | 07 066642 | 3/1995 |
| JP | 09 321555 | 12/1997 |

OTHER PUBLICATIONS

Robinson A. N. et al.: "On The Design Of Gallium Arsenide Receiver Pre–Amplifiers For Optical Communication Systems" Poster Sessions. Singapore, Jun. 11–14, 1991, Proceedings of the International Symposium on Circuits And Systems, New York IEEE, US, vol. 5 SYMP. 24, Jun. 11, 1991, pp. 2987–2990.

"Bias Circuit For Bipolar–Transimpedance Amplifier" IBM Technical Disclosure Bulletin, IBM Corp. New York, US. vol. 34, No. 7B, Dec. 1, 1991, pp. 43–46.

* cited by examiner

Primary Examiner—Henry Choe

(57) ABSTRACT

A DC feedback control circuit for compensating for a DC voltage level shift in a transimpedance amplifier circuit having a transistor as a high speed switching device. The DC feedback control circuit includes a filter for determining a DC voltage level at an output of the amplifier circuit and a differential pair of transistors for comparing the DC voltage level with a reference voltage. A pair of current mirrors mirror a current dependent on the comparison of the DC voltage level with the reference voltage and apply the mirrored current to an emitter of the transistor so as to maintain a substantially constant bias current through the switching transistor.

11 Claims, 1 Drawing Sheet

US 6,741,134 B2

DC FEEDBACK CONTROL CIRCUIT

FIELD OF THE INVENTION

This invention relates, in general, to a DC feedback control circuit and more particularly, though not exclusively, to such a circuit used for compensating for a DC level shift in a circuit using a resistor as a current source, for example a high frequency amplifier.

BACKGROUND OF THE INVENTION

In integrated circuits, a DC voltage applied to a particular component can often change as a result of changes in temperature, supply voltage, or even in response to a data signal being applied to the circuit. When a transistor is being used as an amplifier, to achieve the maximum switching speed for that amplifier the bias current of the switching transistor should be maintained at or near $I_C$ for peak $F_T$ where $F_T$ is the transition frequency and $I_C$ is the current flowing through the collector of the transistor. It will thus be apparent that if the DC voltage of the transistor changes, this will often cause a change in the bias current, leading to a reduction in the high speed performance of the circuit.

It is therefore an object of the present invention to provide a DC feedback control circuit which can overcome, or at least alleviate the problems caused by a fluctuating DC level.

BRIEF SUMMARY OF THE INVENTION

Accordingly, in a first aspect, the present invention provides a DC feedback control circuit for controlling the DC level of a circuit element having a current electrode of a transistor coupled to the signal output terminal, the DC feedback control circuit comprising an input terminal for coupling to a signal output terminal of the circuit element, a filter coupled to the input terminal, a comparator coupled to the filter and to a reference voltage input for comparing a DC voltage level at the signal output terminal with a reference voltage, a current mirror circuit coupled to the comparator and having an output terminal for coupling to a current electrode of the transistor of the circuit element, wherein the current mirror circuit mirrors the current output of the comparator to the output terminal.

According to a second aspect of the present invention, there is provided a high frequency amplifier comprising an amplifier circuit having an input, at least one transistor having a first current electrode coupled to a first voltage supply rail and a second current electrode coupled to a second voltage supply rail, and a signal output terminal coupled to the first current electrode of the at least one transistor, and a DC feedback control circuit as described above wherein the input terminal is coupled to the signal output terminal and the output terminal is coupled to the second current electrode of the at least one transistor.

In a third aspect, the invention provides a method of compensating for a DC voltage level shift in a circuit using a resistor as a current source and a transistor as a high speed switching device, the method comprising the steps of determining a DC voltage level at an output of the circuit, comparing the DC voltage level with a reference voltage, mirroring a current dependent on the comparison of the DC voltage level with the reference voltage, and applying the mirrored current to the transistor at an emitter thereof to maintain a substantially constant bias current therethrough.

BRIEF DESCRIPTION OF THE DRAWINGS

An embodiment of the present invention will now be described, by way of example, with reference to the accompanying drawing which shows a circuit diagram of a DC feedback control circuit according to one embodiment of the present invention used to control the DC level of a transimpedance amplifier.

DETAILED DESCRIPTION OF THE DRAWINGS

Figure 1:
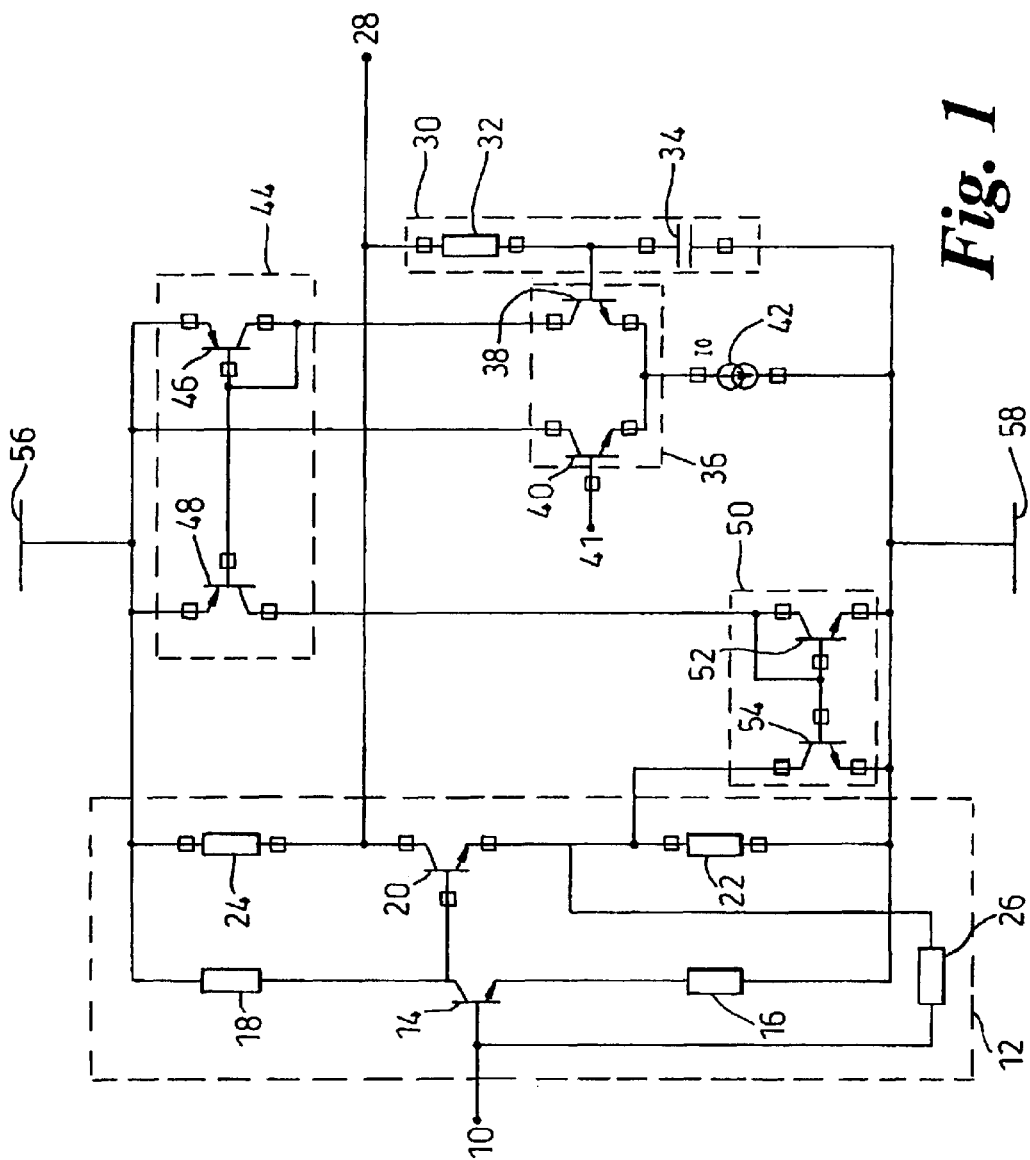

Thus, in FIG. 1 a transimpedance amplifier 12 has a signal input 10 coupled to a base electrode of a first transistor 14. An emitter electrode of the first transistor 14 of the transimpedance amplifier 12 is coupled to a resistor 16 and a collector electrode of the first transistor 14 of the transimpedance amplifier 12 is coupled to a resistor 18.

A base electrode of a second transistor 20 of the transimpedance amplifier 12 is coupled to the collector electrode of the first transistor 14 of transimpedance amplifier 12. An emitter electrode of the second transistor 20 of the transimpedance amplifier 12 is coupled to a resistor 22 and a collector electrode of the second transistor 20 of the transimpedance amplifier 12 is coupled to a resistor 24. Both the resistor 18 and the resistor 24 are coupled to a relative supply voltage rail 56. Both the resistor 16 and the resistor 22 are coupled to a relative ground voltage rail 58. An additional resistor 26 is coupled between the emitter electrode of the second transistor 20 of the transimpedance amplifier 12 and the signal input 10. Furthermore, the collector electrode of the second transistor 20 of the transimpedance amplifier 12 is coupled to a signal output 28.

The DC feedback control circuit includes a filter 30 coupled to the signal output 28. The filter 30 comprises a resistor 32 and a capacitor 34 connected in series. A differential pair 36 of transistors 38 and 40 is connected to the filter 30 between the resistor 32 and the capacitor 34. More specifically, a base electrode of a first transistor 38 of the differential pair 36 is connected to the filter 30. An emitter electrode of the first transistor 38 of the differential pair 36 and an emitter electrode of the second transistor 40 of the differential pair 36 are symmetrically connected to a current source 42 which, in turn, is connected to a relative ground voltage rail 58. A base electrode of the second transistor 40 of the differential pair 36 is coupled to a reference voltage 41. A collector electrode of the second transistor 40 of the differential pair 36 is connected to the relative supply voltage rail 56. The voltage on the signal output 28 is thus filtered by filter 30 to remove any AC components and provide a DC level, which is then compared by differential pair 36 to the reference voltage 41.

A collector electrode of the first transistor 38 of the differential pair 36 is coupled to a collector electrode of a first transistor 46 of a first current mirror 44. A base electrode of the first transistor 46 of the first current mirror 44 is coupled to a base electrode of a second transistor 48 of the first current mirror 44. Emitter electrodes of both the first transistor 46 and the second transistor 48 of the first current mirror are coupled to the relative supply voltage rail 56. Also, the base electrode and the collector electrode of the first transistor 46 of the first current mirror 44 are coupled together.

The first current mirror 44 is connected to a second current mirror 50. More specifically, a collector electrode of the second transistor 48 of the first current mirror 44 is connected to a collector electrode of a first transistor 52 of a second current mirror 50. A base electrode of the first transistor 52 of the second current mirror 50 is coupled to a base electrode of a second transistor 54 of the second current mirror 50. Emitter electrodes of both the first transistor 52 and the second transistor 54 of the second current mirror 50 are coupled to the relative ground voltage rail 58. Also, the base electrode and the collector electrode of the first transistor 52 of the second current mirror 50 are coupled together.

The second current mirror 50 is connected to the transimpedance amplifier 12. More specifically, a collector electrode of the second transistor 54 of the second current mirror 50 is coupled between the emitter electrode of the second transistor 20 and resistor 22 of the transimpedance amplifier 12.

In operation, a signal is applied to the signal input 10 and amplified by the transimpedance amplifier 12. An output signal is filtered by the filter 30. The capacitor 34 functions to remove any a.c. aspect present in the output signal, so that the d.c. level of the output signal is applied to the differential pair 36. The differential pair 36 functions as a comparator to compare the DC level of the output signal with the reference voltage 41, which determines a level of feedback. A current determined by the level of feedback is passed from the collector electrode of the first transistor 38 of the differential pair 36 to the collector electrode of the first transistor 46 of the first current mirror 44, where it is mirrored by second transistor 48 and applied to second current mirror 50. The current is fed back through the second current mirror 50 and applied to the emitter electrode of the second transistor 20 of the transimpedance amplifier 12 to maintain a near constant bias current flowing through the transistor.

The characteristics of the feedback current can be adjusted to feedback any proportion of the DC voltage change required, dependant on the level of the reference voltage 41.

Advantageously, a near constant bias current flowing through the second transistor 20 of transimpedance amplifier 12 is achieved by the present invention, even if the DC voltage of second transistor 20 changes. Thus, a change in bias current which can impair maximum switching-speed of the transimpedance amplifier 12 is avoided. The above technique is particularly useful in high frequency amplifiers, such as transimpedance amplifiers, where the bias voltages are strongly dependent on signal amplitude.

Whilst the invention has been described above in respect of a particular embodiment, namely a transimpedance amplifier, it will be appreciated that the present invention is applicable to any integrated circuit in which the DC voltage applied is susceptible to change. Furthermore, it will be appreciated that the above description has been given by way of example only and that a person skilled in the art can make modifications and improvement without departing from the scope of the present invention.

What is claimed is:

1. A DC feedback control circuit for controlling the DC level of a circuit element having a current electrode of a transistor coupled to a signal output terminal, the DC feedback control circuit comprising:

an input terminal for coupling to the signal output terminal of the circuit element;
a filter coupled to the input terminal;
a comparator coupled to the filter and to a reference voltage input for comparing a DC voltage level at the signal output terminal with a reference voltage;
a current mirror circuit coupled to the comparator and having an output terminal for coupling to a current electrode of the transistor of the circuit element, wherein the current mirror circuit mirrors the current output of the comparator to the output terminal.

2. A DC feedback control circuit according to claim 1, wherein the comparator comprises a differential pair of transistors.

3. A DC feedback control circuit according to claim 1, wherein the current mirror circuit comprises a pair of current mirrors, wherein a first current mirror of the pair of current mirrors has an input coupled to an output of the comparator and an output coupled to an input of a second current mirror of the pair of current mirrors, an output of the second current mirror being coupled to the output terminal.

4. A DC feedback control circuit according to claim 1, wherein the filter comprises an RC filter.

5. The DC feedback control circuit of claim 1, in combination with a high frequency amplifier having an input, at least one transistor having a first current electrode coupled to a first voltage supply rail and a second current electrode coupled to a second voltage supply rail, and a signal output terminal coupled to the first current electrode of the at least one transistor, the input terminal being coupled to the signal output terminal and the output terminal being coupled to the second current electrode of the at least one transistor.

6. The combination according to claim 5, wherein the amplifier circuit is a transimpedance amplifier circuit.

7. The combination according to claim 5, wherein the first current electrode of the at least one transistor is coupled to the first voltage supply rail via a first resistor.

8. The combination according to claim 5, wherein the second current electrode of the at least one transistor is coupled to the second voltage supply rail via a second resistor.

9. The combination according to claim 5, further comprising a second transistor having a first current electrode coupled to the first voltage supply rail via a third resistor and to the base electrode of the at least one transistor, a second current electrode coupled to the second voltage supply rail via a fourth resistor, and a fifth resistor coupled between the second current electrode of the at least one transistor and a base electrode of the second transistor.

10. A method of compensating for a DC voltage level shift in a circuit using a resistor as a current source and a transistor as a high speed switching device, the method comprising the steps of:

determining a DC voltage level at an output of the circuit;
comparing the DC voltage level with a reference voltage;
mirroring a current dependent on the comparison of the DC voltage level with the reference voltage; and
applying the mirrored current to the transistor at an emitter thereof to maintain a substantially constant bias current therethrough.

11. A method of compensating for a DC voltage level shift according to claim 10, wherein the circuit is a transimpedance amplifier.

* * * * *

UNITED STATES PATENT AND TRADEMARK OFFICE
CERTIFICATE OF CORRECTION

PATENT NO. : 6,741,134 B2  
DATED : May 24, 2004  
INVENTOR(S) : Charles Graeme Ritchie It is certified that error appears in the above-identified patent and that said Letters Patent is hereby corrected as shown below:

Title page,
Item [75], Inventors, should read -- Charles Graeme Ritchie, Ipawich (GB) --

Signed and Sealed this

Thirtieth Day of November, 2004

JON W. DUDAS
*Director of the United States Patent and Trademark Office*